US012628538B2

(12) United States Patent
Li et al.

(10) Patent No.: US 12,628,538 B2
(45) Date of Patent: May 12, 2026

(54) PIXEL STRUCTURE INCLUDING ANODE OVERLAPPING WITH RECOGNITION HOLE AND DISPLAY PANEL INCLUDING THE SAME

(71) Applicant: HKC Corporation Limited, Shenzhen (CN)

(72) Inventors: Jing Li, Shenzhen (CN); Ting Zhou, Shenzhen (CN); Qi Mu, Shenzhen (CN); Hailiang Wang, Shenzhen (CN); Laidi Wu, Shenzhen (CN); Tianjun Huang, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 361 days.

(21) Appl. No.: 18/232,961

(22) Filed: Aug. 11, 2023

(65) Prior Publication Data

US 2024/0292723 A1    Aug. 29, 2024

(30) Foreign Application Priority Data

Feb. 28, 2023    (CN) ........................ 202310174006.X

(51) Int. Cl.
 H10K 59/80 (2023.01)
 H10K 59/122 (2023.01)
 (Continued)

(52) U.S. Cl.
 CPC ....... H10K 59/8792 (2023.02); H10K 59/122 (2023.02); H10K 59/90 (2023.02); *H10K 59/35* (2023.02)

(58) Field of Classification Search
 CPC ............. H10K 59/8792; H10K 50/818; H10K 50/856; H10K 59/00; H10K 59/65; Y02E 10/549
 See application file for complete search history.

(56) References Cited

U.S. PATENT DOCUMENTS

2015/0249119 A1    9/2015    In et al.
2021/0376003 A1*    12/2021    Xu ..................... H10K 59/8792
 (Continued)

FOREIGN PATENT DOCUMENTS

CN    109685003 A    4/2019
CN    111599846 A    8/2020
 (Continued)

OTHER PUBLICATIONS

The first Office Action issued in corresponding CN application No. 202310174006.X dated Mar. 30, 2023.
 (Continued)

*Primary Examiner* — Nduka E Ojeh
(74) *Attorney, Agent, or Firm* — Scully, Scott, Murphy & Presser, P.C.

(57) ABSTRACT

A pixel structure and a display panel are provided. The pixel structure includes multiple pixel units arranged in an array. Each pixel unit includes a blocking layer, an anode layer, and a photosensor. The blocking layer is provided with a recognition hole penetrating through the blocking layer in a thickness direction of the pixel unit. Part of the anode layer and part of the blocking layer are disposed opposite to each other in the thickness direction. The anode layer includes an anode and a reflective layer. The anode includes a reflective region and a non-reflective region. The reflective region is disposed around the non-reflective region, and the reflective layer covers a surface of the reflective region of the anode. The photosensor is disposed at a side of the anode layer away from the blocking layer. The recognition hole is opposite to the photosensor in the thickness direction.

20 Claims, 5 Drawing Sheets

(51) Int. Cl.
    *H10K 59/35*           (2023.01)
    *H10K 59/90*           (2026.01)

(56)                 References Cited

U.S. PATENT DOCUMENTS

| | | | |
|---|---|---|---|
| 2021/0397806 A1* | 12/2021 | Lu | G06V 10/143 |
| 2022/0171956 A1* | 6/2022 | Shi | H10K 59/122 |
| 2022/0376215 A1* | 11/2022 | Gao | H10K 59/122 |
| 2023/0109356 A1* | 4/2023 | Bae | H10K 71/00 |
| | | | 257/40 |
| 2023/0298381 A1* | 9/2023 | Xu | H10K 59/38 |
| | | | 345/156 |

FOREIGN PATENT DOCUMENTS

| | | |
|---|---|---|
| CN | 111668284 A | 9/2020 |
| CN | 114625264 A | 6/2022 |

OTHER PUBLICATIONS

Notice of Allowance issued in corresponding CN application No. 202310174006.X dated Apr. 15, 2023.

\* cited by examiner

PIXEL STRUCTURE INCLUDING ANODE OVERLAPPING WITH RECOGNITION HOLE AND DISPLAY PANEL INCLUDING THE SAME

CROSS-REFERENCE TO RELATED APPLICATIONS

This application claims priority under 35 U.S.C. § 119(a) to Chinese Patent Application No. 202310174006.X, filed Feb. 28, 2023, the entire disclosure of which is incorporated herein by reference.

TECHNICAL FIELD

The present disclosure relates to the field of display technology, and in particular to a pixel structure and a display panel.

BACKGROUND

At present, electronic devices such as mobile phones or tablet computers are configured with a fingerprint recognition function, and fingerprint recognition can be used for operations such as unlocking or payment. Fingerprint recognition can simplify operations such as password input, and improve the feeling of use. However, existing fingerprint recognition can only be performed on a small region of a screen, and a user needs to perform alignment in use, resulting in an insufficiently simplified usage process.

SUMMARY

Embodiments of the present disclosure provide a pixel structure and a display panel.

According to a first aspect, the present disclosure provides a pixel structure. The pixel structure includes multiple pixel units. The multiple pixel units are arranged in an array. Each pixel unit includes a blocking layer, an anode layer, and a photosensor. The blocking layer is provided with a recognition hole penetrating through the blocking layer in a thickness direction of the pixel unit. Part of the anode layer and part of the blocking layer are disposed opposite to each other in the thickness direction. The anode layer includes an anode and a reflective layer. The anode includes a reflective region and a non-reflective region. An orthographic projection of the non-reflective region in the thickness direction covers the recognition hole. The reflective region is disposed around the non-reflective region. The reflective layer covers a surface of the reflective region of the anode. The photosensor is disposed at a side of the anode layer away from the blocking layer, and the recognition hole is opposite to the photosensor in the thickness direction.

In a second aspect, the present disclosure provides a display panel. The display panel includes a first substrate and the pixel structure mentioned above, where the pixel structure is connected to the first substrate.

BRIEF DESCRIPTION OF THE DRAWINGS

To describe the technical solutions of the present disclosure more clearly, the following briefly introduces the accompanying drawings required for describing the embodiments. Apparently, the accompanying drawings in the following description merely illustrate some embodiments of the present disclosure, and a person of ordinary skill in the art can further derive other accompanying drawings based on these accompanying drawings without creative efforts.

Figure 1:
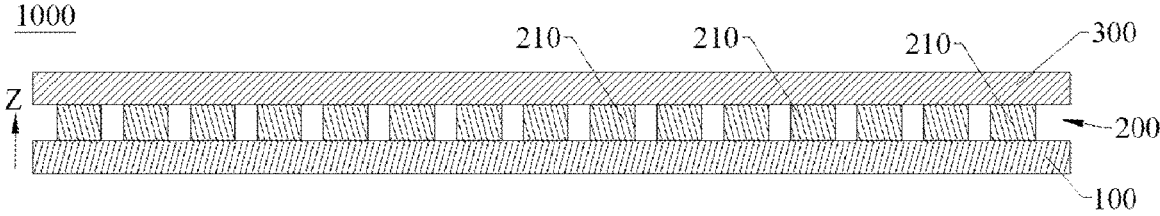
FIG. 1 is a schematic cross-sectional view of a display panel provided by the present disclosure.

Reference numerals: display panel 1000, pixel structure 200, first substrate 100, second substrate 300, pixel unit 210, thin film transistor 211, anode layer 212, light-emitting layer 213, cathode 214, encapsulation layer 215, blocking layer 216, sub-pixel 217, protection layer 218, photosensor 219, spacer 240, anode 2121, reflective layer 2122, reflective region 2123, non-reflective region 2124, matrix hole 2161, recognition hole 2162, first sub-layer 2151, second sub-layer 2152, and third sub-layer 2153.

DETAILED DESCRIPTION

For ease of understanding, the terms involved in the embodiments of the present disclosure are first explained.

"And/or" may merely illustrate an association relationship of associated objects, and represents that three relationships may exist, for example, A and/or B may represent three cases: A exists alone, both A and B exist, and B exists alone.

"A plurality of" and "multiple" may mean two or more than two.

"Connection" and "coupling" can be understood broadly, for example, connection (coupling) between A and B may be direct connection (coupling) between A and B, or indirect connection (coupling) between A and B through an intermediate medium.

Embodiments of the present disclosure will be clearly described hereinafter in conjunction with the accompanying drawings.

At present, electronic devices such as mobile phones or tablet computers are configured with a fingerprint recognition function, and fingerprint recognition can be used for operations such as unlocking or payment. Fingerprint recognition can simplify operations such as password input, and improve the feeling of use. However, existing fingerprint recognition can only be performed on a small region of a screen, and a user needs to perform alignment in use, resulting in an insufficiently simplified usage process.

On this basis, the embodiments of the present disclosure provide a pixel structure and a display panel, which can perform fingerprint recognition on a whole screen, and thus a fingerprint alignment operation of a user can be omitted.

Referring to FIG. 1, FIG. 1 is a schematic cross-sectional view of a display panel 1000 according to the present disclosure. The display panel 1000 includes a pixel structure 200, a first substrate 100, and a second substrate 300. The pixel structure 200 is connected to both the first substrate 100 and the second substrate 300. Specifically, the first substrate 100 is disposed opposite to the second substrate 300. The pixel structure 200 includes multiple pixel units 210. The multiple pixel units 210 are located between the first substrate 100 and the second substrate 300. The multiple pixel units 210 are arranged in an array.

The display panel 1000 may be, but is not limited to, an electronic device such as a cell phone, a notebook computer, a tablet personal computer, a laptop computer, a personal digital assistant, a wearable device, or a vehicle-mounted device (e.g., a mobile device).

It is to be understood that, the first substrate 100 and the second substrate 300 can form two outer surface structures of the display panel 1000 in a Z direction to protect the pixel units 210 arranged between the first substrate 100 and the second substrate 300. Furthermore, the first substrate 100 and the second substrate 300 can also prevent arrangement of the multiple pixel units 210 from being disrupted due to external force.

Exemplarily, the first substrate 100 and/or the second substrate 300 may be a glass substrate, a sapphire substrate, or a silicon wafer substrate. Alternatively, the first substrate 100 and/or the second substrate 300 may be a flexible substrate. The flexible substrate may be made of any one or more of the following materials: polyimide, Polyethylene Terephthalate (PET), Polyethylene Naphthalate (PEN), Cycloolefin Polymer (COP), Polycarbonate (PC), Polystyrene (PS), Polypropylene (PP), and Polytetrafluoroethylene (PTFE). In other embodiments, the first substrate 100 and/or the second substrate 300 may also be a ceramic substrate, which is not limited in the present disclosure.

Figure 2:
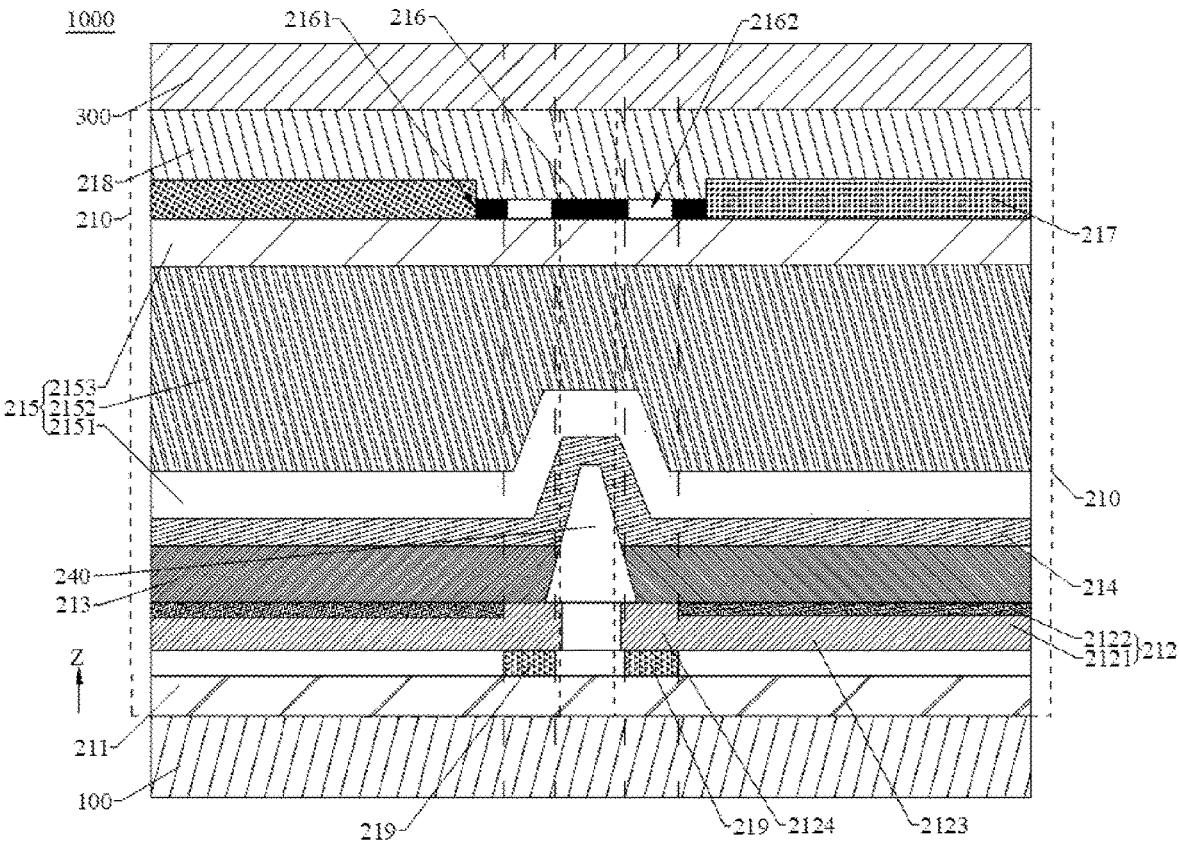
FIG. 2 is a schematic cross-sectional view of the display panel illustrated in FIG. 1.

Referring to FIG. 2, FIG. 2 is a schematic cross-sectional view of the display panel 1000 as illustrated in FIG. 1. The direction indicated by Z in FIG. 2 is the thickness direction of the pixel structure 200. Each pixel unit 210 includes a Thin Film Transistor (TFT) 211, an anode layer 212, a light-emitting layer 213, a cathode 214, an encapsulation layer 215, a blocking layer 216, a sub-pixel 217, a protection layer 218, and a photosensor 219. The TFT 211, the anode layer 212, the light-emitting layer 213, the cathode 214, the encapsulation layer 215, the blocking layer 216, the sub-pixel 217, and the protection layer 218 are all located between the first substrate 100 and the second substrate 300.

It is to be noted that, FIG. 2 merely exemplarily describes connection relationships among the first substrate 100, the TFT 211, the anode layer 212, the light-emitting layer 213, the cathode 214, the encapsulation layer 215, the blocking layer 216, the sub-pixel 217, the protection layer 218, the photosensor 219, and the second substrate 300, and is not a specific limit to connection positions of the devices, specific structures of the devices, and the number of the devices. However, the structure illustrated in the embodiments of the present disclosure does not constitute a specific limitation to the pixel structure 200. In other embodiments of the present disclosure, the pixel structure 200 may include more or less components than those illustrated in the drawings, or some components in the drawings may be combined or divided, or the pixel structure 200 may have a component arrangement different from that illustrated in the drawings. The illustrated components may be implemented in hardware, software, or a combination of software and hardware.

The pixel structure 200 may further include a spacer 240. The spacer 240 is arranged between the light-emitting layers 213 of two adjacent pixel units 210, and the spacer 240 may protrude towards the cathode 214 and/or part of the encapsulation layer 215. Exemplarily, the pixel structure 200 may include a pixel unit 210 that can emit red light, a pixel unit 210 that can emit green light, and a pixel unit 210 that can emit blue light.

It can be understood that the spacer 240 can prevent the light-emitting layers 213 of two adjacent pixel units 210 from contacting with each other, to prevent lights emitted by the light-emitting layers 213 of different colors from mixing together, and thus the display color of the display panel 1000 is not affected. Since recombination rates of electrons and holes in the light-emitting layers 213 of different colors may be different, the colors of light exited due to contact between the electrons and the holes are also different. If the light-emitting layers 213 of two adjacent pixel units 210 are in contact with each other, the recombination rates of the electrons and the holes in the two light-emitting layers 213 may be affected, thereby affecting excitation of light. Therefore, in the case where two adjacent light-emitting layers 213 are separated by the spacer 240, excitation of light can be prevented from being affected.

Referring to FIG. 2 again, in the pixel unit 210, the TFT 211, the anode layer 212, the light-emitting layer 213, the cathode 214, the encapsulation layer 215, and the blocking layer 216 are sequentially arranged in the Z direction, and the sub-pixel 217 and the blocking layer 216 are both located on a surface of the encapsulation layer 215 away from the cathode 214. That is, the sub-pixel 217 and the blocking layer 216 are located at the same layer of the pixel unit 210.

The TFT 211 is located at a side of the first substrate 100 facing the Z direction. The TFT 211 is located at a side of the anode layer 212 away from the blocking layer 216. The TFT 211 can drive each pixel unit 210 separately. Alternatively, the TFT 211 can drive the multiple pixel units 210 simultaneously to display an image. Exemplarily, the TFT 211 provided by the present disclosure may be a TFT with a dual-gate structure, a TFT with a bottom-gate structure or a TFT with a top-gate structure.

Each pixel unit 210 may include at least one photosensor 219. The photosensor 219 is disposed at a side of the anode layer 212 away from the blocking layer 216. The photosensor 219 can receive light reflected to the inside of the display panel 1000 by an object outside the display panel 1000 (i. e., fingerprint of a user described below).

Figure 3:
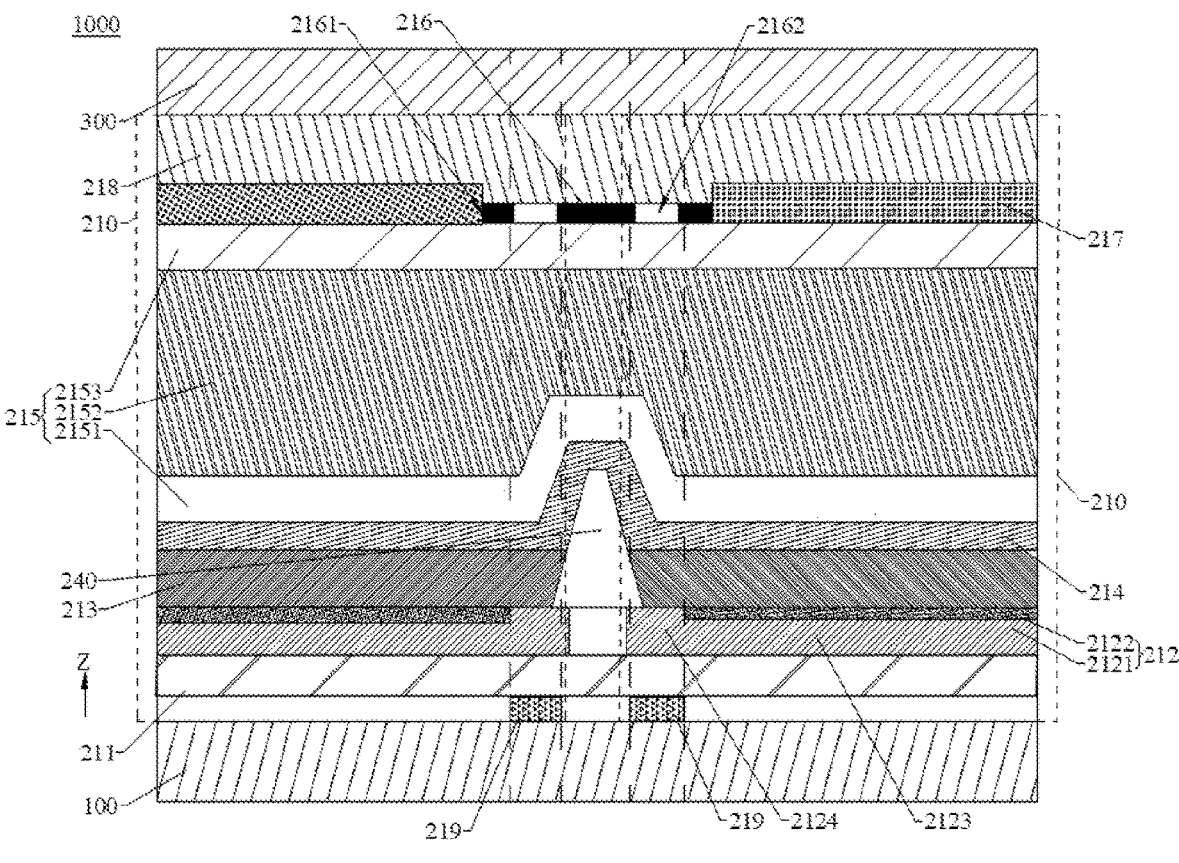
FIG. 3 is another schematic cross-sectional view of the display panel illustrated in FIG. 1.
Figure 4:
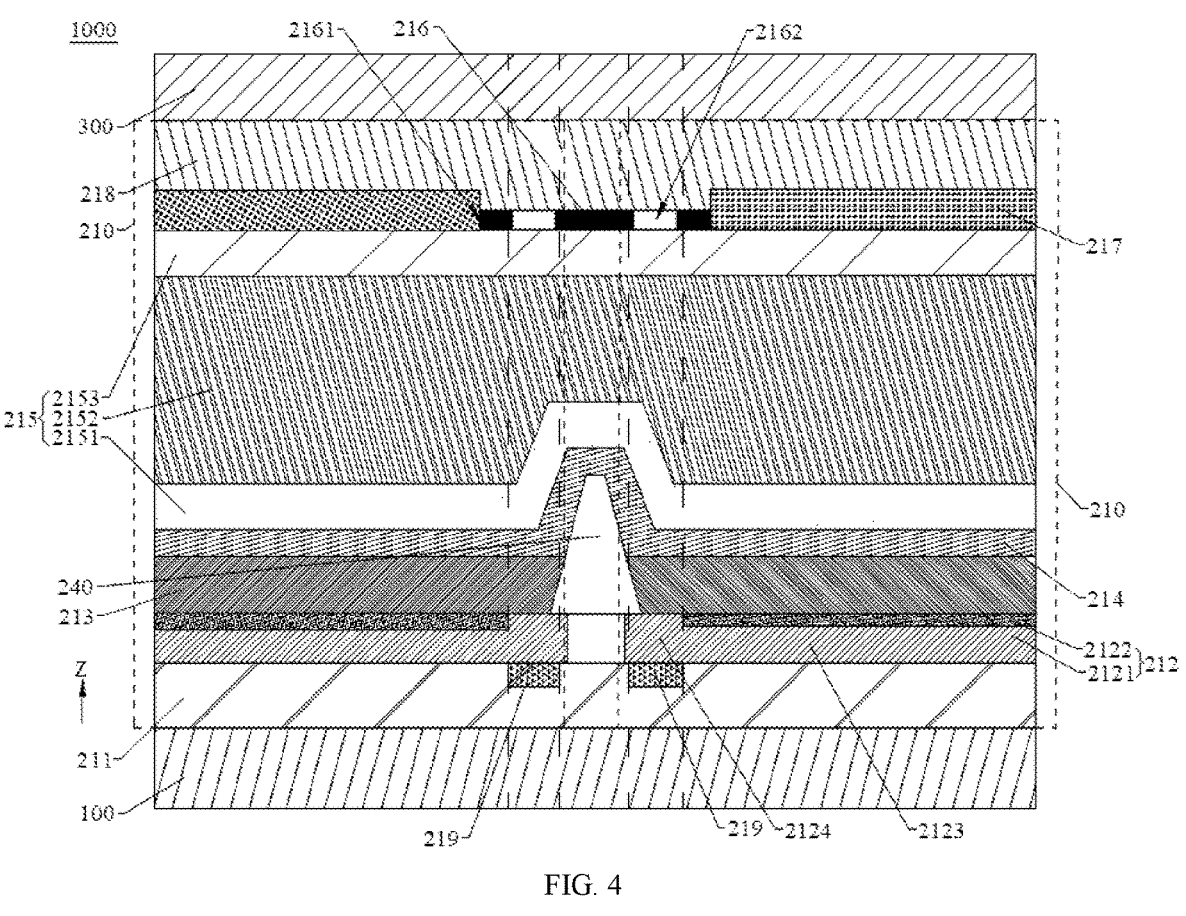
FIG. 4 is yet another schematic cross-sectional view of the display panel illustrated in FIG. 1.

In a possible embodiment, referring to FIG. 2 again, the photosensor 219 is located on a surface of the TFT 211 facing the anode layer 212. In another possible embodiment, referring to FIG. 3, FIG. 3 is another schematic cross-sectional view of the display panel 1000 as illustrated in FIG. 1, where the photosensor 219 is located on a surface of the TFT 211 away from the anode layer 212. In yet another possible embodiment, referring to FIG. 4, FIG. 4 is yet another cross-sectional view of the display panel 1000 illustrated in FIG. 1, where the photosensor 219 is embedded in the TFT 211.

The anode layer 212 is disposed at a side of the TFT 211 facing the Z direction, and is configured to provide holes for the light-emitting layer 213. The anode layer 212 includes an anode 2121 and a reflective layer 2122. The anode 2121 includes a reflective region 2123 and a non-reflective region 2124. The photosensor 219 and the non-reflective region 2124 are disposed opposite to each other in the Z direction. The reflective region 2123 is disposed around the non-reflective region 2124, and the reflective layer 2122 covers a surface of the reflective region 2123. Exemplarily, each pixel unit 210 may include multiple reflective regions 2123, and the multiple reflective regions 2123 may be disposed at intervals.

Exemplarily, the reflective layer 2122 may be disposed at a side of the anode 2121 facing the TFT 211, or the reflective layer 2122 may be disposed at a side of the anode 2121 facing away from the TFT 211. Alternatively, the reflective layer 2122 can be disposed on two surfaces of the anode 2121 opposite each other in the Z direction, and the position where the reflective layer 2122 is disposed is not specifically limited in the present disclosure.

It can be understood that, when the light-emitting layer 213 emits light, the reflective layer 2122 of the anode layer 212 can reflect light in a light-exiting direction at a side of the anode layer 212, so as to prevent light emitted by the light-emitting layer 213 from overflowing in a direction towards the anode layer 212. The reflective layer 2122 can enhance the brightness of the light emitted by the light-emitting layer 213, thereby enhancing the brightness of the pixel unit 210, and in turn enhancing the display effect of the display panel 1000.

In addition, the non-reflective region 2124 of the anode 2121 can allow light to pass, i. e., light in the Z axis can enter the display panel 1000, so as to provide a passage for light reflected by an object outside the display panel 1000 (i. e., the fingerprint of the user described below).

The light-emitting layer 213 is disposed at a side of the anode layer 212 away from the TFT 211. The light-emitting layer 213 can receive holes injected by the anode 2121 and electrons injected by the cathode 214. After the holes and the electrons are transferred to the light-emitting layer 213, the holes and the electrons encounter at the light-emitting layer 213, and energy excitons are generated to excite luminescent molecules to finally generate visible light. The light-emitting layer 213 provided by the present disclosure is made of an organic material, and light-emitting layers of different materials can emit light of different colors. Exemplarily, light-emitting layers of different pixel units in the present disclosure can emit red light, green light, and blue light.

It is to be understood in current market, a display panel in which a light-emitting layer is made of an organic material is generally referred to as an Organic Light-Emitting Diode (OLED) display. It is easy to manufacture the OLED display, and only a low driving voltage is required for the OLED display. These characteristics make the OLED display prominent in applications of a flat panel display. The OLED display is lighter and thinner than a liquid crystal display, has high brightness, low power consumption, quick response, high definition, good flexibility, and high light-emitting efficiency, and can better meet new requirements of consumers for display technologies.

The blocking layer 216 is disposed on part of a surface of the encapsulation layer 215 facing the Z direction, and the blocking layer 216 is located in the Z direction of the anode layer 212. Part of the blocking layer 216 and part of the anode layer 212 are disposed opposite to each other in the Z direction. The blocking layer 216 is located between the encapsulation layer 215 and the second substrate 300. It is to be noted that each pixel unit 210 includes part of the blocking layer 216.

Referring to FIG. 2 again, the blocking layer 216 is a Black Matrix (BM). The blocking layer 216 includes a matrix hole 2161 and a recognition hole 2162 arranged in an array. Both the matrix hole 2161 and the recognition hole 2162 penetrate the blocking layer 216 in the Z direction. The matrix hole 2161 can provide an installation position for the sub-pixel 217. The matrix hole 2161 is disposed opposite to part of the light-emitting layer 213 in the Z direction. The recognition hole 2162 can allow light reflected by the fingerprint to pass therethrough. The recognition hole 2162 is disposed opposite to part of the light-emitting layer 213 in the Z direction, and the recognition hole 2162 is disposed opposite to the photosensor 219 in the Z direction. In each pixel unit 210, the recognition hole 2162 may be covered by an orthographic projection of the non-reflective region 2124 in the Z direction.

Figure 5:
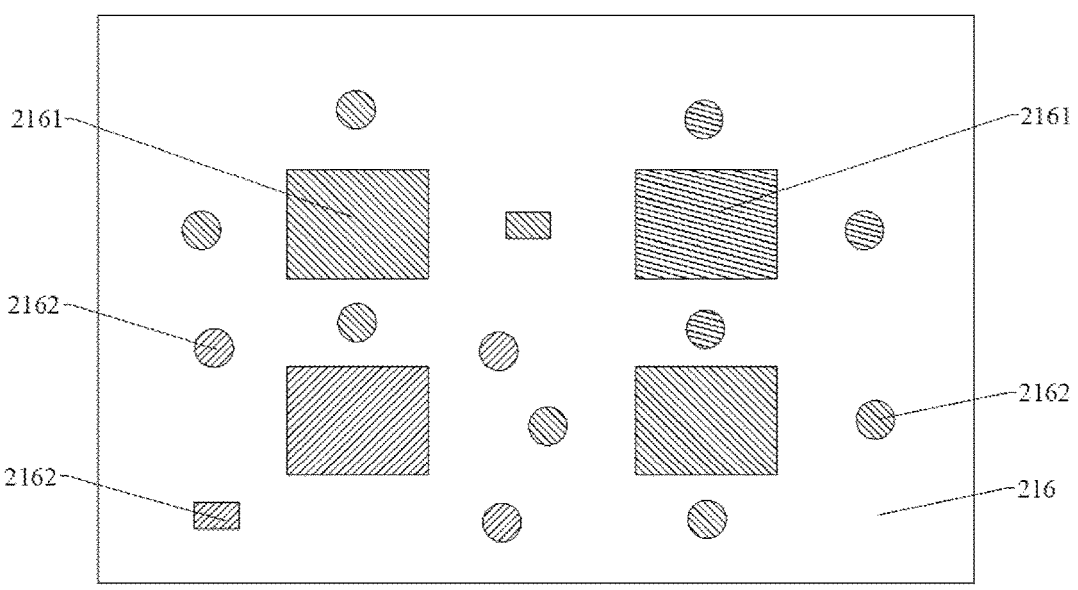
FIG. 5 is a schematic view illustrating distribution of matrix holes and recognition holes in a blocking layer illustrated in FIG. 2.

In a possible embodiment, the blocking layer 216 of each pixel unit 216 may be provided with multiple recognition holes 2162. The multiple recognition holes 2162 are disposed at intervals, and the multiple recognition holes 2162 may be disposed around one matrix hole 2161. The number of the non-reflective regions 2124 is the same as the number of the recognition holes 2162, and each recognition hole 2162 is disposed corresponding to one non-reflective region 2124. There may be multiple photosensors 219, and each photosensor 219 is disposed opposite to one non-reflective region 2124 in the Z direction. Referring to FIG. 5, FIG. 5 is a schematic view illustrating distribution of the matrix holes 2161 and the recognition holes 2162 of the blocking layer 50 illustrated in FIG. 2. The recognition hole 2162 may be circular or square in shape.

It can be understood that, the blocking layer 216 may block light emitted by the light-emitting layer 213, so that the light emitted by the light-emitting layer 213 can only emit from the matrix hole 2161 to avoid leakage of the light emitted by the light-emitting layer 213, thereby preventing color or brightness displayed from being affected. Light emitted by the display panel 1000 may reach the recognition hole 2162 through reflection of the fingerprint of the user, and the light reaches the photosensor 219 through the recognition hole 2162. The photosensor 219 can recognize the light reflected by the fingerprint, thereby recognizing the fingerprint of the user.

In addition, when the display panel 1000 displays an image, the light-emitting layer 213 located at a position opposite the Z direction of the recognition hole 2162 can directly emit light such as red light, green light or blue light to display an image.

The cathode 214 is disposed at a side of the light-emitting layer 213 facing the Z direction, and the cathode 214 is disposed between the light-emitting layer 213 and the encapsulation layer 215. The cathode 214 can provide electrons for the light-emitting layer 213, so that the electrons can be injected to the light-emitting layer 213, and then the light-emitting layer 213 can emit light under the action of the anode 2121 and the cathode 214.

The encapsulation layer 215 is disposed at a side of the cathode 214 facing the Z direction, and the encapsulation layer 215 is disposed between the blocking layer 216 and the cathode 214. The encapsulation layer 215 can cover the cathode 214 to protect components such as the cathode 214. Specifically, the encapsulation layer 215 includes a first sub-layer 2151, a second sub-layer 2152, and a third sub-layer 2153 that are sequentially arranged in the Z direction. The first sub-layer 2151 and the third sub-layer 2153 each may be made of an inorganic material, and the second sub-layer 2152 may be made of an organic material layer.

It is to be understood that, the first sub-layer 2151 can encapsulate components (namely, the cathode 214, the light-emitting layer 213, the anode layer 212, and so on) located in a direction opposite the Z direction, to prevent these components from being in contact with external water vapor and oxygen, thereby preventing the cathode 214, the light-emitting layer 213, and the anode layer 212 from being corroded by external water vapor and oxidized by oxygen.

In addition, the second sub-layer 2152 can fill gaps between the multiple pixel units 210 and flatten a surface of the pixel structure 200 perpendicular to the Z direction, so that the surface of the pixel structure 200 is smooth. Furthermore, the second sub-layer 2152 can also enhance the structural strength of the pixel unit 210. Since the encapsulation layer 215 can cover the cathodes 214 of the multiple pixel units 210, the encapsulation layer 215 can enable the multiple pixel units 210 to be relatively fixed, thereby improving the structural strength of the pixel structure 200, and thus the pixel structure 200 has certain impact resistance. The second sub-layer 2152 can further have a heat-dissipation function, so that the pixel units 210 each can dissipate heat well without affecting each other, and thus each pixel unit 210 can better emit light separately.

Moreover, since the second sub-layer 2152 is made of an organic material, the second sub-layer 2152 is more likely to be corroded by oxygen, moisture, and the like. The third sub-layer 2153 can encapsulate the second sub-layer 2152 to prevent the second sublayer 2152 from being oxidized or destroyed. The blocking layer 216 is located on part of a surface of the third sub-layer 2153 facing the Z direction.

In the embodiment, the multiple pixel units 210 include a red pixel sub-unit, a green pixel sub-unit, and a blue pixel sub-unit. The red pixel sub-unit corresponds to a light-emitting layer 213, the green pixel sub-unit corresponds to a light-emitting layer 213, and the blue pixel sub-unit corresponds to a light-emitting layer 213. The light-emitting layer 213 corresponding to the read pixel sub-unit can emit read light, the light-emitting layer 213 corresponding to the green pixel sub-unit can emit green light, and the light-emitting layer 213 corresponding to the blue pixel sub-unit can emit blue light.

The sub-pixel 217 is disposed in the matrix hole 2161. Each pixel unit 210 includes one sub-pixel 217. The sub-pixel 217 of each pixel unit 210 may be arranged to adapt to the color of the light-emitting layer 213.

It can be understood that, the sub-pixel 217 can purify the color of the light-emitting layer 213, so that the color of an image displayed on the display panel 1000 can be more controllable and true. The sub-pixel 217 can also prevent ambient light from entering the light-emitting layer 213, and thus the light-emitting layer 213 can be prevented from illumination and accordingly aging of the light-emitting layer 213 can be avoided.

The protective layer 218 is disposed on a surface of the sub-pixel 217 and a surface of the BM that face the second substrate 300, and the protective layer 218 is disposed between the sub-pixel 217 and the second substrate 300. The protective layer 218 can be configured to encapsulate structures such as the sub-pixel 217 and the blocking layer 216, and to flatten the surface of the sub-pixel 217 and the surface of the blocking layer 216 that face away from the encapsulation layer 215, thereby facilitating connection with the second substrate 300. Furthermore, the protective layer 218 can also prevent oxygen, moisture or light from directly contacting components such as the sub-pixel 217, and thus the sub-pixel 217 can be prevented from external erosion and accordingly aging of the sub-pixel 217 can be avoided.

It is to be noted that the recognition hole 2162 of the blocking layer 216, the non-reflective region 2124 of the anode 2121, and the photosensor 219 are sequentially arranged in a direction opposite the Z direction. The recognition hole 2162 and the non-reflective region 2124 form a collimating hole structure, so that light reflected by the fingerprint can pass through the recognition hole 2162 and the non-reflective region 2124 sequentially, and finally reach the photosensor 219 to be recognized by the photosensor 219.

Figure 6:
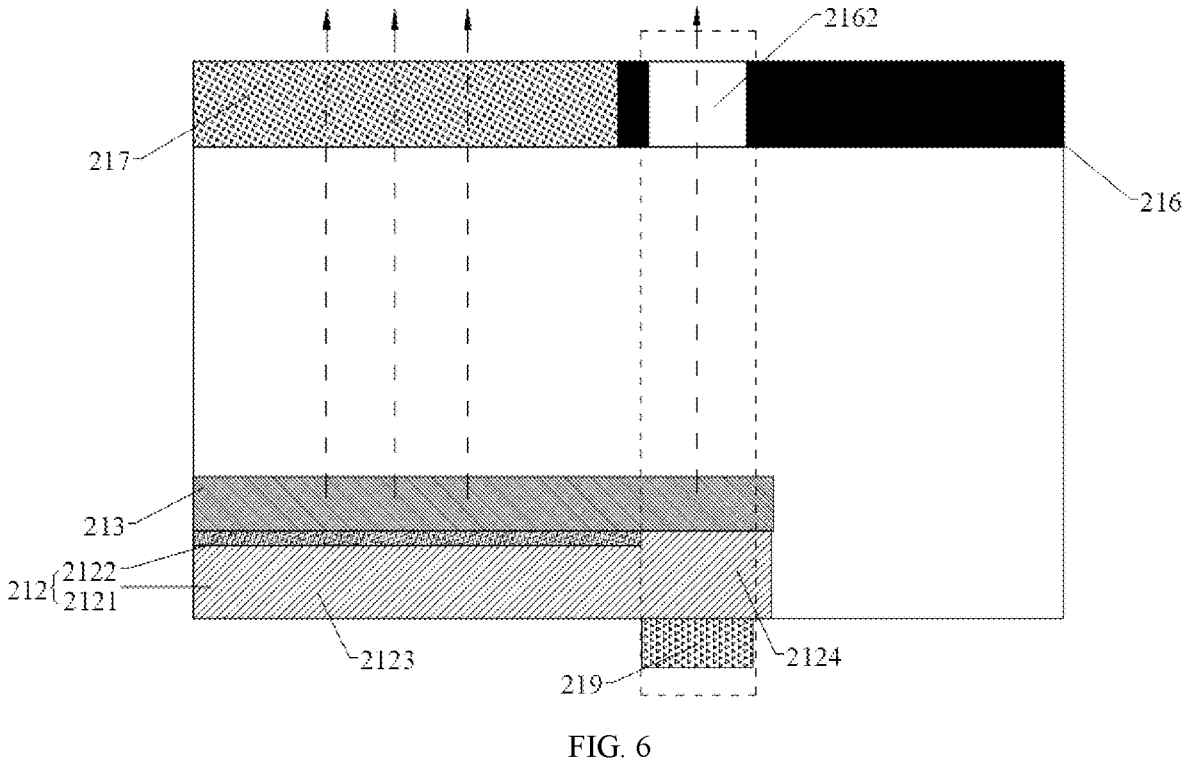
FIG. 6 is a schematic structural view of part of a pixel structure illustrated in FIG. 1 in a display state.

The display panel 1000 may include two operating states, which are a display state and a fingerprint recognition state, respectively. Referring to FIG. 6, FIG. 6 is a schematic structural view of part of the pixel structure 200 illustrated in FIG. 1 in the display state, where the display panel 1000 is in the display state. The light-emitting layer 213 can emit light, and the light can pass through the sub-pixel 217 and the recognition hole 2162 of the blocking layer 216.

It can be understood that, since the blocking layer 216 is provided with the recognition hole 2162, in the display state, with the pixel structure 200, the display area can be increased, so that the maximum display brightness of the display panel 1000 can be increased, thereby improving the display performance of the display panel 1000.

Figure 7:
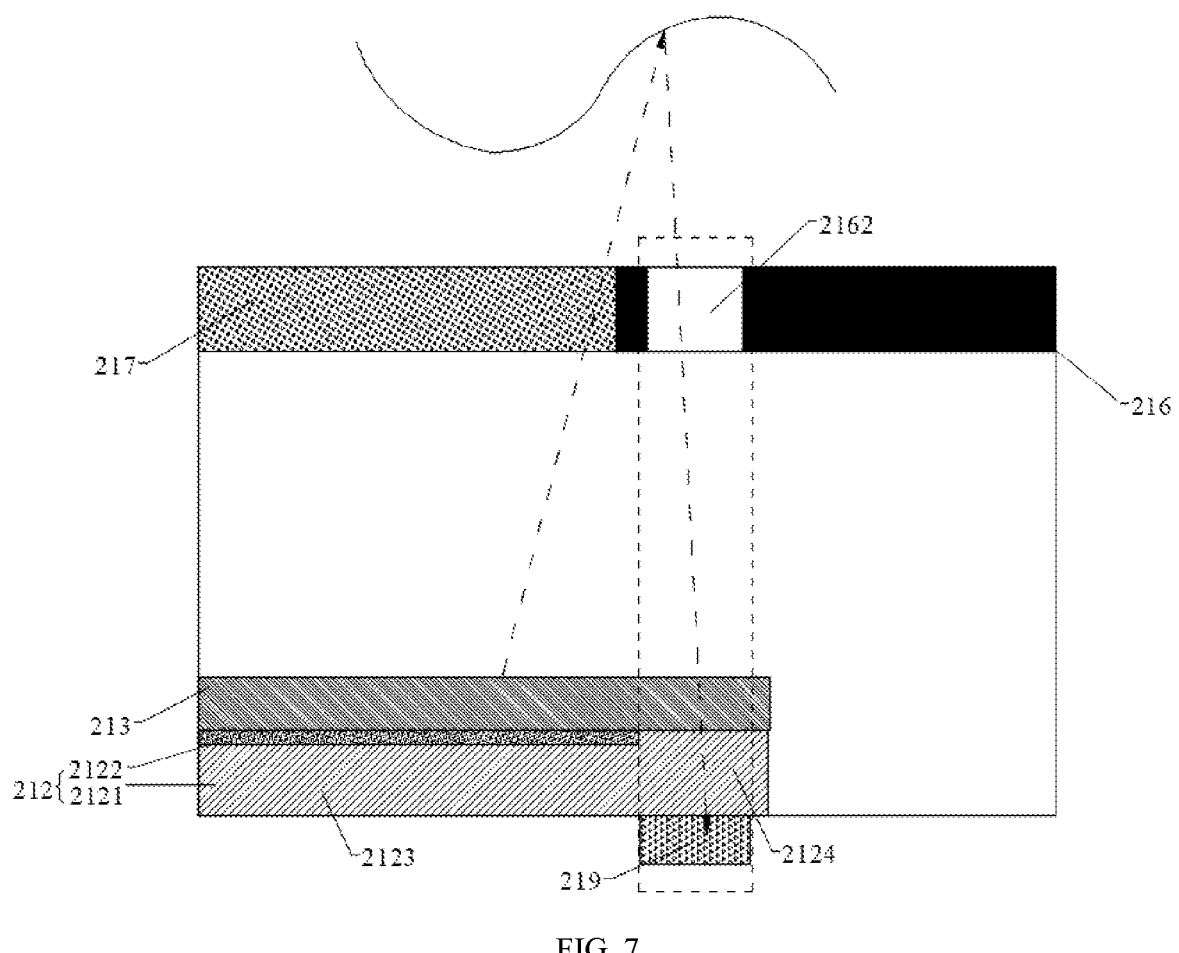
FIG. 7 is a schematic structural view of part of the pixel structure illustrated in FIG. 1 in a fingerprint recognition state.

Referring to FIG. 7, FIG. 7 is a schematic structural view of part of the pixel structure 200 illustrated in FIG. 1 in the fingerprint recognition state, where the display panel 1000 is in the fingerprint recognition state. After light passing through the sub-pixel 217 is reflected by the fingerprint, the light sequentially enters the recognition hole 2162 of the blocking layer 216 and the non-reflective region 2124 of the anode 2121, and finally reaches the photosensor 219. Because light reflected by a fingerprint ridge (raised position) of the fingerprint and light reflected by a fingerprint valley (recessed position) of the fingerprint are different, the photosensor 219 can perform light judgement. The multiple pixel units 210 can recognize different positions of the fingerprint, thereby determining the overall morphology of the fingerprint.

The embodiments of the present disclosure are introduced in detail above. Specific examples are used in the present disclosure to set forth the principle and embodiments of the present disclosure, and the illustration of the above embodiments is only used to help understand the method of the present disclosure and the core idea of the present disclosure. Meanwhile, a person of ordinary skill in the art may make modifications to the specific implementations and application scopes according to the idea of the present disclosure. In conclusion, the content of the description shall not be construed as a limitation to the present disclosure.

What is claimed is:

1. A pixel structure, comprising a plurality of pixel units, the plurality of pixel units being arranged in an array, and each of the plurality of pixel units comprising:

a blocking layer provided with a recognition hole, wherein the recognition hole penetrates through the blocking layer in a thickness direction of the pixel unit;

an anode layer, wherein part of the anode layer and part of the blocking layer are disposed opposite to each other in the thickness direction, the anode layer comprises an anode and a reflective layer, the anode comprises a reflective region and a non-reflective region, an orthographic projection of the non-reflective region in the thickness direction covers the recognition hole, the reflective region is disposed around the non-reflective region, and the reflective layer covers a surface of the reflective region of the anode; and a photosensor disposed at a side of the anode layer away from the blocking layer, wherein the recognition hole is opposite to the photosensor in the thickness direction.

2. The pixel structure of claim 1, wherein the photosensor is implemented as a plurality of photosensors, and the recognition hole of the blocking layer is implemented as a plurality of recognition holes, the plurality of recognition holes are arranged at intervals, the non-reflective region of the anode is implemented as a plurality of non-reflective regions, and a number of the non-reflective regions is the same as a number of the recognition holes, each of the plurality of non-reflective regions and each of the plurality of photosensors are opposite to one of the plurality of recognition holes in the thickness direction, and each of the plurality of photosensors is opposite to one of the plurality of non-reflective regions in the thickness direction.

3. The pixel structure of claim 2, wherein each of the plurality of pixel units comprises a light-emitting layer and a sub-pixel corresponding to the light-emitting layer, the blocking layer further comprises a matrix hole, the sub-pixel is connected to the matrix hole, the sub-pixel is opposite to the light-emitting layer in the thickness direction, and the light-emitting layer is located between the light-blocking layer and the anode layer.

4. The pixel structure of claim 3, wherein each of the plurality of pixel units further comprises a Thin Film Transistor (TFT), wherein the TFT is disposed at a side of the anode layer away from the blocking layer.

5. The pixel structure of claim 3, wherein each of the plurality of pixel units further comprises a cathode, wherein the blocking layer, the cathode, the light-emitting layer, and the anode layer are arranged sequentially, and the light-emitting layer is made of an organic material.

6. The pixel structure of claim 5, wherein the light-emitting layer is configured to emit blue light, green light, or red light.

7. The pixel structure of claim 6, further comprising a spacer disposed between light-emitting layers of two adjacent pixel units.

8. The pixel structure of claim 7, wherein each of the plurality of pixel units further comprises an encapsulation layer disposed between the blocking layer and the cathode.

9. The pixel structure of claim 8, wherein the encapsulation layer comprises a first sub-layer, a second sub-layer, and a third sub-layer sequentially arranged in the thickness direction, each of the first sub-layer and the third sub-layer is made of an inorganic material, and the second sub-layer is made of an organic material.

10. The pixel structure of claim 3, wherein each of the plurality of pixel units further comprises a TFT disposed at a side of the anode layer away from the blocking layer, wherein the photosensor is located on a surface of the TFT facing the anode layer, located on a surface of the TFT away from the anode layer, or embedded in the TFT.

11. The pixel structure of claim 3, wherein each of the plurality of pixel units further comprises a protection layer disposed on a surface of the sub-pixel and a surface of the blocking layer.

12. A display panel, comprising:
a first substrate; and
a pixel structure connected to the first substrate, wherein the pixel structure comprises a plurality of pixel units, the plurality of pixel units are arranged in an array, and each of the plurality of pixel units comprises:
    a blocking layer provided with a recognition hole, wherein the recognition hole penetrates through the blocking layer in a thickness direction of the pixel unit;
    an anode layer, wherein part of the anode layer and part of the blocking layer are disposed opposite to each other in the thickness direction, the anode layer comprises an anode and a reflective layer, the anode comprises a reflective region and a non-reflective region, an orthographic projection of the non-reflective region in the thickness direction covers the recognition hole, the reflective region is disposed around the non-reflective region, and the reflective layer covers a surface of the reflective region of the anode; and
    a photosensor disposed at a side of the anode layer away from the blocking layer, wherein the recognition hole is opposite to the photosensor in the thickness direction.

13. The display panel of claim 12, wherein the photosensor is implemented as a plurality of photosensors, and the recognition hole of the blocking layer is implemented as a plurality of recognition holes, the plurality of recognition holes are arranged at intervals, the non-reflective region of the anode is implemented as a plurality of non-reflective regions, and a number of the non-reflective regions is the same as a number of the recognition holes, each of the plurality of non-reflective regions and each of the plurality of photosensors are opposite to one of the plurality of recognition holes in the thickness direction, and each of the plurality of photosensors is opposite to one of the plurality of non-reflective regions in the thickness direction.

14. The display panel of claim 13, wherein each of the plurality of pixel units comprises a light-emitting layer and a sub-pixel corresponding to the light-emitting layer, the blocking layer further comprises a matrix hole, the sub-pixel is connected to the matrix hole, the sub-pixel is opposite to the light-emitting layer in the thickness direction, and the light-emitting layer is located between the light-blocking layer and the anode layer.

15. The display panel of claim 14, wherein each of the plurality of pixel units further comprises a Thin Film Transistor (TFT), wherein the TFT is disposed at a side of the anode layer away from the blocking layer.

16. The display panel of claim 14, wherein each of the plurality of pixel units further comprises a cathode, wherein the blocking layer, the cathode, the light-emitting layer, and the anode layer are arranged sequentially, and the light-emitting layer is made of an organic material.

17. The display panel of claim 16, wherein the light-emitting layer is configured to emit blue light, green light, or red light.

18. The display panel of claim 17, wherein the pixel structure further comprises a spacer disposed between light-emitting layers of two adjacent pixel units.

19. The display panel of claim 18, wherein each of the plurality of pixel units further comprises an encapsulation layer disposed between the blocking layer and the cathode.

20. The display panel of claim 19, wherein the encapsulation layer comprises a first sub-layer, a second sub-layer, and a third sub-layer sequentially arranged in the thickness direction, each of the first sub-layer and the third sub-layer is made of an inorganic material, and the second sub-layer is made of an organic material.

* * * * *